US010887984B2

(12) United States Patent
Uchida et al.

(10) Patent No.: US 10,887,984 B2
(45) Date of Patent: Jan. 5, 2021

(54) RESIN COMPOSITION, PREPREG, METAL-CLAD LAMINATE, AND WIRING BOARD

(71) Applicant: KYOCERA Corporation, Kyoto (JP)

(72) Inventors: Kazumichi Uchida, Yokohama (JP); Chie Chikara, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 19 days.

(21) Appl. No.: 15/539,269

(22) PCT Filed: Feb. 5, 2016

(86) PCT No.: PCT/JP2016/053443
§ 371 (c)(1),
(2) Date: Jun. 23, 2017

(87) PCT Pub. No.: WO2016/132929
PCT Pub. Date: Aug. 25, 2016

(65) Prior Publication Data
US 2017/0354033 A1 Dec. 7, 2017

(30) Foreign Application Priority Data

Feb. 19, 2015 (JP) ................................. 2015-030200

(51) Int. Cl.
| | |
|---|---|
| *H05K 1/03* | (2006.01) |
| *B32B 15/08* | (2006.01) |
| *C08J 5/24* | (2006.01) |
| *C08J 5/04* | (2006.01) |
| *B32B 27/30* | (2006.01) |
| *B32B 15/14* | (2006.01) |
| *B32B 27/28* | (2006.01) |
| *C08K 5/14* | (2006.01) |
| *C08K 5/3492* | (2006.01) |
| *C08L 71/12* | (2006.01) |
| *B32B 27/18* | (2006.01) |
| *C08F 290/06* | (2006.01) |
| *C08K 3/36* | (2006.01) |
| *H05K 3/02* | (2006.01) |

(52) U.S. Cl.
CPC .......... *H05K 1/0373* (2013.01); *B32B 15/08* (2013.01); *B32B 15/14* (2013.01); *B32B 27/18* (2013.01); *B32B 27/28* (2013.01); *B32B 27/302* (2013.01); *C08F 290/062* (2013.01); *C08J 5/043* (2013.01); *C08J 5/24* (2013.01); *C08K 5/14* (2013.01); *C08K 5/34924* (2013.01); *C08L 71/12* (2013.01); *C08L 71/126* (2013.01); *H05K 1/0366* (2013.01); *B32B 2250/02* (2013.01); *B32B 2264/102* (2013.01); *B32B 2457/00* (2013.01); *C08J 2371/12* (2013.01); *C08K 3/36* (2013.01); *H05K 3/022* (2013.01)

(58) Field of Classification Search
CPC .... C08L 71/126; H05K 1/0353; H05K 1/056; H05K 3/022; C08K 5/14; C08K 5/34924; C08K 3/36; B32B 15/08; B32B 15/085; C08F 290/062; C08J 5/24
See application file for complete search history.

(56) References Cited

U.S. PATENT DOCUMENTS

| | | | | |
|---|---|---|---|---|
| 6,352,782 B2* | 3/2002 | Yeager | ................. | C08G 65/485 428/457 |
| 6,627,704 B2* | 9/2003 | Yeager | ................. | C08G 65/485 428/457 |
| 2001/0047055 A1* | 11/2001 | Takeuchi | .............. | C08L 53/025 525/88 |
| 2004/0204528 A1* | 10/2004 | Saito | ....................... | C08L 23/12 524/445 |
| 2014/0044918 A1* | 2/2014 | Zeng | .................... | C08G 65/485 428/141 |

FOREIGN PATENT DOCUMENTS

| | | |
|---|---|---|
| JP | 2003-012820 A | 1/2003 |
| JP | 2003-119371 A | 4/2003 |
| JP | 2003-515642 A | 5/2003 |
| JP | 2004-231781 A | 8/2004 |
| JP | 2005-008829 A | 1/2005 |
| WO | 01/40354 A1 | 6/2001 |

OTHER PUBLICATIONS

Machine translation of JP2003119371A, p. 1-14, originally published Apr. 23, 2003.*
International Search Report, PCT/JP2016/053443, dated Apr. 26, 2016, 2 pgs.
Panasonic, "Next Generation Low-Loss Material for ICT Equipment," Megtron7, (Core: R-5785, Prepreg: R-5680) (Mar. 2014).

* cited by examiner

*Primary Examiner* — Robert S Jones, Jr.
(74) *Attorney, Agent, or Firm* — Volpe Koenig

(57) ABSTRACT

A resin composition contains a component (A) being a polyphenylene ether in which the hydroxy group at an end of the main chain thereof has been modified with an ethylenically unsaturated compound, a component (B) being at least one of triallyl isocyanurate and triallyl cyanurate, and a component (C) being an organic peroxide containing no benzene ring. The component (C) is contained with a proportion of 0.1% to 7% by mass relative to 100% by mass of the total mass of the components (A), (B), and (C).

8 Claims, No Drawings

RESIN COMPOSITION, PREPREG, METAL-CLAD LAMINATE, AND WIRING BOARD

TECHNICAL FIELD

The present disclosure relates to a resin composition, a prepreg, a metal-clad laminate, and a wiring board.

BACKGROUND ART

As highly integrated high-speed LSIs and high-capacity memory devices are being developed, various electronic components are rapidly being reduced in size, weight, thickness, and the like. Accordingly, the materials of such electronic components are required to have high heat resistance and good dimensional stability and electrical properties. Among the materials, polyphenylene ether attracts attention, and researches on application thereof to copper clad laminates are made (PTL 1).

CITATION LIST

Patent Literature

PTL 1: Japanese Unexamined Patent Application Publication No. 2005-8829

SUMMARY OF INVENTION

The resin composition of the present disclosure contains a component (A) that is a polyphenylene ether in which the hydroxy group at an end of the main chain thereof has been modified with an ethylenically unsaturated compound, a component (B) that is at least one of triallyl isocyanurate and triallyl cyanurate, and a component (C) that is an organic peroxide containing no benzene ring. The component (C) is contained with a proportion of 0.1% to 7% by mass relative to 100% by mass of the total mass ((A)+(B)+(C)) of the components (A), (B), and (C).

The prepreg of the present disclosure includes the resin composition and a base material.

The metal-clad laminate of the present disclosure includes the prepreg and an electrically conductive metal foil on the surface of the prepreg.

The wiring board of the present disclosure includes a plurality of insulating layers, and an electrically conductive layer between the insulating layers, each of the insulating layers including the resin composition and the base material.

DESCRIPTION OF EMBODIMENTS

The resin composition of the present disclosure contains a component (A) that is a polyphenylene ether in which the hydroxy group at an end of the main chain thereof has been modified with an ethylenically unsaturated compound, a component (B) that is at least one of triallyl isocyanurate and triallyl cyanurate, and a component (C) that is an organic peroxide containing no benzene ring. The component (C) is contained with a proportion of 0.1% to 7% by mass relative to 100% by mass of the total mass of the components (A), (B), and (C).

The component (A) used in the resin composition of the present disclosure may be, but is not limited to, a compound represented by, for example, the following formula (I). The compound represented by formula (I) is described in, for example, Japanese Patent No. 4913970.

[Chem 1]

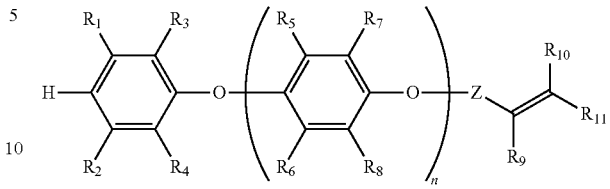

In formula (I), $R_1$ to $R_{11}$ each independently represent a hydrogen atom, a substituted or unsubstituted linear or branched alkyl group having a carbon number of 1 to 8, a substituted or unsubstituted linear or branched alkenyl group having a carbon number of 2 to 8, a substituted or unsubstituted linear or branched alkynyl group having a carbon number of 2 to 8, or a substituted or unsubstituted aryl group having a carbon number of 6 to 10. Exemplary substituents of these groups include carboxy, aldehyde, hydroxy, and amino. Z represents carbonyl ($>C=O$), thiocarbonyl ($>C=S$), methylene ($—CH_2—$), ethylene (dimethylene) ($—CH_2—CH_2—$), trimethylene ($—CH_2—CH_2—CH_2—$), or tetramethylene ($—CH_2—CH_2—CH_2—CH_2—$). n represents an integer of 1 to 200.

The component (A) used in a resin composition of the present disclosure may be a compound of formula (I) in which $R_1$ to $R_{11}$ are each a hydrogen atom, a methyl group, an ethyl group, or a substituted or unsubstituted phenyl group.

The content of the component (A) is not particularly limited, and the component (A) may be contained with a proportion of 29.9% to 90% by mass relative to 100% by mass of the total mass of the component (A) and the later-described components (B) and (C). By adding the component (A) with such a proportion, dielectric constant and dielectric loss tangent can be further reduced. The component (A) may be contained with a proportion of 40% to 75% by mass.

The component (B) used in the resin composition of the present disclosure functions as a crosslinking agent, and either triallyl isocyanurate or triallyl cyanurate, or both may be used. By using at least one of triallyl isocyanurate and triallyl cyanurate, good dielectric properties and high heat resistance are exhibited.

The content of the component (B) is not particularly limited, and the component (B) may be contained with a proportion of 9.9% to 70% by mass relative to 100% by mass of the total mass of the components (A) and (B) and the later-described component (C). By adding the component (B) with such a proportion, a higher heat resistance is exhibited. The component (B) may be contained with a proportion of 20% to 50% by mass.

The component (C) used in the resin composition of the present disclosure functions as a radical initiator. In other words, the component (C) is used for obtaining a crosslinked produce of the components (A) and (B) by a radical reaction of the components (A) and (B). The component (C) is an organic peroxide containing no benzene ring. By using an organic peroxide containing no benzene ring, dielectric loss tangent can be efficiently reduced. Examples of the component (C) include, but are not limited to, di-t-butyl peroxide, 2,5-dimethyl-2,5-di(t-butyl peroxide)hexane, and 2,5-dimethyl-2,5-di(t-butyl peroxide)hexyne-3. These compounds are commercially available as, for example, "PERBUTYL D", "PERHEXA 25B", or "PERHEXYNE 25B" (each produced by NOF Corporation).

The component (C) in the resin composition of the present disclosure is contained with a proportion of 0.1% to 7% by mass relative to 100% by mass of the total mass of the components (A), (B), and (C). When the content of the component (C) is less than 0.1% by mass, heat resistance is lost. When the content of the component (C) exceeds 7% by mass, heat resistance decreases.

The content of the component (C) may be 1% to 6% by mass. The component (C) with such a proportion helps an efficient crosslinking reaction between the component (A) and the component (B) and reduces dielectric loss tangent. The component (C) may be contained with a proportion of 2% to 4% by mass.

As described above, the resin composition of the present disclosure contains the components (A), (B), and (C), and the component (C) is contained with a proportion of 0.1% to 7% by mass relative to 100% by mass of the total mass of the components (A), (B), and (C). Thus, the dielectric constant and the dielectric loss tangent of the resin composition of the present disclosure are reduced.

The resin composition of the present disclosure may optionally contain a mixture of polybutadiene and polystyrene or a butadiene-styrene copolymer (component (D)), a silicone polymer having a core-shell structure (component (E)), and other additives, such as silica, a flame retardant, and a stress reducing agent, as needed, within a range in which the advantages of an embodiment of the invention are not reduced. If any of these additives is used, the content thereof is appropriately determined according to the additive to be added. Additives may be added so that the total mass of the components (A), (B), and (C) in the resin composition would be at least 25% by mass. Additives may be added so that the total mass of the components (A), (B), and (C) in the resin composition would be 35% to 85% by mass.

The component (D) reacts with the components (A) and (B) to form a polymer (crosslinked product). More specifically, the double bonds of the mixture or the copolymer react with the double bonds in the molecules of the components (A) and (B).

When the component (D) is a mixture of polybutadiene and polystyrene, the mass ratio between the polybutadiene and the polystyrene is not particularly limited. The mass ratio of the polybutadiene to the polystyrene in the mixture may be 5:95 to 95:5. When polybutadiene and polystyrene are contained with such a mass ratio, the adhesion to a metal foil can be increased, and the heat resistance of the wiring board can be increased.

When the component (D) is a butadiene-styrene copolymer, the proportion of the butadiene and the styrene in the copolymer is not particularly limited. For example, the butadiene-styrene copolymer may be copolymerized with a mass ratio of 5:95 to 95:5. By using a copolymer of butadiene and styrene with such a weight ratio, the adhesion to a metal foil can be increased, and the heat resistance of the wiring board can be further increased. Also, the weight average molecular weight or the number average molecular weight of the copolymer is not particularly limited. For example, an oligomer with a relatively low polymerization degree (with a low molecular weight) may be used as the copolymer. A copolymer having a number average molecular weight of about 1,000 to about 100,000 may be used.

If the component (D) is used, the proportion of the component (D) may be 0.5% to 20% by mass relative to 100% by mass of the total mass of the components (A), (B), (C), and (D). When the mixture or copolymer described above is contained with such a proportion, adhesion can be increased with dielectric constant and dielectric loss tangent kept low. The mixture or copolymer may be contained with a proportion of 3% to 15% by mass.

The silicone polymer having a core-shell structure (component (E)) refers to a silicone polymer having a core portion and a shell portion. More specifically, the silicone polymer having a core portion and a shell portion is a polymer including a particulate core portion and a shell portion formed around the periphery of the core portion, and at least either the core portion or the shell portion is made of a silicone polymer.

The component (E) may be produced by any method as long as a polymer that can define the shell portion can be formed around the periphery of the particulate core portion. For example, the component (E) may be produced by polymerizing a monomer forming the shell portion in the presence of silicone polymer particles (core portions). The monomer used in this process is not particularly limited and is, in general, different from the monomer forming the silicone polymer of the core portion.

The monomer forming the shell portion may be, for example, a monomer reactive with the silicone polymer forming the core portion. Such a monomer is grafted onto the periphery of the core portion, thus helping to form a core-shell silicone including a silicone polymer core portion and a graft copolymer around the core portion.

If the component (E) is used, a core-shell silicone having an average particle size of 0.1 μm to 5 μm may be used or a core-shell silicone having an average particle size of 0.5 μm to 2.0 μm may be used. Alternatively, a commercially available core-shell silicone, such as KMP-600 (produced by Shin-Etsu Chemical Co., Ltd.), may be used.

If the component (E) is used, the proportion of the component (E) may be 0.1% to 5% by mass relative to 100% by mass of the total mass of the components (A), (B), (C), and (E). When the component (E) is contained with such a proportion, the resin composition can exhibit higher elasticity while keeping the dielectric constant and the dielectric loss tangent low. The component (E) may be contained with a proportion of 1.0% to 3.0% by mass.

For silica, for example, ground silica, fused silica, or any other silica may be used singly or in combination. More specifically, examples of the silica include methacrylate silane-treated fused silica SFP-130MC (produced by Denka Company Limited), and FUSELEX E-2, Adma Fine SO-05, and PLV-3 (each produced by Tatsumori Ltd.) Silica particles having an average particle size of 10 μm or less may be used as the silica. By using silica particles having such an average particle size in the resin composition of, for example, a metal-clad laminate, the adhesion to the metal foil can be increased. The silica may be contained with a proportion of 5% to 40% by mass relative to 100% by mass of the total mass of the components (A), (B), and (C). By adding silica with such a proportion, the melt flowability of the resin composition can be increased. If the resin composition is used for, for example, a metal-clad laminate, in addition, the adhesion to the metal foil can be increased, and the reliability of through-hole connection can be further increased.

Examples of the flame retardant include, but are not limited to, melamine phosphate, melam polyphosphate, melem polyphosphate, melamine pyrophosphate, ammonium polyphosphate, red phosphorus, aromatic phosphate esters, phosphonate esters, phosphinate esters, phosphine oxide, phosphazene, melamine cyanurate, ethylenebispentabromobenzene, and ethylenebistetrabromophthalimide. These flame retardants may be used singly or in combination. Melamine pyrophosphate, melamine polyphosphate, melam polyphosphate, or ammonium polyphosphate may be used from the viewpoints of dielectric properties, flame resistance, heat resistance, adhesion, moisture resistance, chemical resistance, reliability, and so forth.

The flame retardant may be contained with a proportion of 15% to 45% by mass relative to 100% by mass of the total mass of the components (A), (B), and (C). By adding the flame retardant with such a proportion, flame resistance and heat resistance can be increased without substantial influence on dielectric properties, adhesion, and moisture resistance.

The stress reducing agent may be, but is not limited to, silicone resin particles other than the above-described core-shell silicone. Examples of the silicone resin particles include silicone rubber powder, such as KMP-597 (produced by Shin-Etsu Chemical Co., Ltd.) or X-52-875 (produced by Shin-Etsu Chemical Co., Ltd.), and silicone resin powder, such as KMP-590 (produced by Shin-Etsu Chemical Co., Ltd.) and X-52-1621 (produced by Shin-Etsu Chemical Co., Ltd.). These stress reducing agents may be used singly or in combination.

The stress reducing agent may have an average particle size of 10 μm or less. By using a stress reducing agent having such an average particle size in the resin composition of, for example, a metal-clad laminate, the adhesion to the metal foil can be further increased. The stress reducing agent may be contained with a proportion of 1% to 10% by mass relative to 100% by mass of the total mass of the components (A), (B), and (C). By adding the stress reducing agent with such a proportion in the resin composition used for a metal-clad laminate or the like, the adhesion to the metal foil and the moisture resistance can be further increased, and the reliability of through-hole connection can also be further increased.

The resin composition of the present disclosure may further contain a filler other than silica, additives, and the like appropriately in addition to the above-described components, according to the application. Examples of the filler other than silica include carbon black, titanium oxide, barium titanate, glass beads, and glass hollow spheres. Examples of the additives include an antioxidant, a heat stabilizer, an antistatic agent, a plasticizer, a pigment, a dye, and a coloring agent. More specifically, additives, such as R-42 (produced by Sakai Chemical Industry Co., Ltd.) and IRGANOX 1010 (produced by BASF) may be used. Fillers or additives may be used singly or in combination.

The resin composition of the present disclosure may further contain at least one of thermoplastic and thermosetting resins other than the mixture of polybutadiene and polystyrene or the butadiene-styrene copolymer described above. The thermoplastic resin may be GPPS (general purpose polystyrene), HIPS (high impact polystyrene), or the like. The thermosetting resin may be, for example, epoxy resin. These resins may be used singly or in combination.

The resin composition of the present disclosure is obtained by, for example, mixing the above-described components (A) to (C) and other components to be optionally added. The method of mixing is however not particularly limited. For mixing the components, for example, the solution mixing method of uniformly dissolving or dispersing all the components in a solvent, or the melt blending method of heating the components in an extruder or the like may be applied.

The solvent used in the solution mixing method may be, for example, toluene. The mass ratio of the solids (resin) to the solvent may be, but is not limited to, 60:40 to 40:60. Other solvents than toluene may be used, and examples thereof include aromatic solvents, such as benzene and xylene; ketones, such as acetone; and other solvents such as tetrahydrofuran and chloroform. Toluene and any of these solvents may be used in combination. In the prepreg disclosed hereinafter, solvents other than toluene do not remain normally. If any solvent other than toluene is used in combination, therefore, the boiling point of the solvent is lower than that of toluene.

The prepreg of the present disclosure is hereafter described. The prepreg of the present disclosure includes the resin composition (resin) of the present disclosure and a base material impregnated with the resin composition. For example, the prepreg is produced by applying the resin composition of the present disclosure to the base material or impregnating the base material with the resin composition of the present disclosure, and then drying the base material. Examples of the base material include glass, woven or nonwoven fabrics of polyimide fibers or the like, and paper. The glass may be common E glass. D glass, S glass, quartz glass, and the like may also be used.

The base material may account for about 20% to 80% by mass of the entire prepreg. When the proportion of the base material is in such a range, the prepreg after being cured is likely to be stable in size and to have a high strength. Also, the dielectric properties are further improved. In the prepreg of the present disclosure, a coupling agent, such as a silane coupling agent or a titanate coupling agent, may optionally be used.

Whether or not the resin in a prepreg is the resin composition of the present disclosure can be checked by infrared spectrophotometry (IR) and gas chromatography (GC). In addition, the constituents and their proportions can be determined by nuclear magnetic resonance spectroscopy (NMR) and mass spectrometry gas chromatography (GC-MS). The resin in the prepreg is in an uncured or a semi-cured state.

The prepreg of the present disclosure may be produced by any method without particular limitation. For example, the resin composition of the present disclosure, which may be uniformly dissolved or dispersed in toluene or any other solvent if necessary, is applied to the base material, or the base material may be impregnated with the resin composition. Then, the resulting base material is dried. Alternatively, the resin composition may be melted, and the base material may be impregnated with the melted resin composition. A method for applying the resin composition or impregnating the base material is not particularly limited, and, for example, a solution or a dispersion liquid of the resin composition may be applied with a spray, a brush, or a bar coater, or the base material may be dipped in the solution or the dispersion liquid of the resin composition (dipping). The application or the impregnation may be repeated several times as needed. The application or the impregnation may be repeated by using a plurality of solutions or dispersion liquids containing the resin composition with different contents.

If toluene is used as the solvent, the amount of toluene remaining in the prepreg of the present disclosure is preferably 0.5% by mass or less and may be 0.3% by mass or less. The amount of remaining toluene may be measured by, for example, but not limited to, gas chromatography. The toluene content in the prepreg is measured by the following method. For example, the resin in the prepreg is dissolved in ethylbenzene, and the resulting solution is introduced into a gas chromatograph. The amount of toluene in the solution is measured, and thus, the toluene content is determined by calculating the mass of toluene in the entire prepreg.

The prepreg of the present disclosure can be processed into a laminate by, for example, heat forming. The laminate is produced by, for example, stacking a number of prepregs according to the desired thickness, placing a sheet, such as a metal foil sheet, on the stack, heating (curing) and pressing the stack, and removing the sheet. The resulting laminate may be combined with another prepreg, and thus a thicker laminate may be produced. Although forming a laminate and curing the laminate are generally performed at one time with a heat press, these may be performed in different steps. More specifically, a semi-cured laminate may be first formed, and then, the laminate may be completely cured by heat treatment using a heat treatment machine. The heating and the pressing are performed at a temperature of 80° C. to 300° C. under a pressure of 0.1 MPa to 50 MPa for about 1 minute to about 10 hours, and may be at a temperature of 150° C. to 250° C. under a pressure of 0.5 MPa to 10 MPa for about 10 minutes to about 5 hours.

Next, the metal-clad laminate of the present disclosure is hereafter described. The metal-clad laminate of the present disclosure includes the prepreg of the present disclosure and a metal foil on the surface of the prepreg. The metal-clad laminate of the present disclosure is produced by, for example, heating (curing) and pressing a stack of the prepreg of the present disclosure and the metal foil. Examples of the metal foil include, but are not limited to, copper foils, such as an electrolytic copper foil and a rolled copper foil, aluminum foils, and composite metal foils formed by layering these metal foils. For example, a copper foil may be selected from these metal foils. The thickness of the metal foil may be, but is not limited to, about 5 μm to about 105 μm. The metal-clad laminate of the present disclosure may be produced by, for example, heating and pressing a stack of a desired number of prepregs of the present disclosure and a desired number of metal foils. The metal-clad laminate of the present disclosure may be used, for example, for a printed board or the like.

Next, the wiring board of the present disclosure is described. The wiring board of the present disclosure includes a plurality of insulating layers, and an electrically conductive layer between the insulating layers. The insulating layer includes the resin composition of the present disclosure and a base material. The wiring board of the present disclosure is produced by, for example, placing a prepreg and an inner layer plate that is the metal-clad laminate of the present disclosure having a circuit and a through hole therein one on the other, placing a metal foil on the surface of the prepreg, and heating (curing) and pressing the stack. Furthermore, a circuit and a through hole may be formed in the metal foil at the surface, and thus, a multilayer printed wiring board may be produced.

As described above, the prepreg and the metal-clad laminate disclosed herein, which use the resin composition of the present disclosure, exhibit a low dielectric constant and dielectric loss tangent. In addition, the wiring board of the present disclosure, which also uses the resin composition of the present disclosure, exhibits good high-frequency properties.

EXAMPLES

Although the embodiments disclosed herein will be described in detail with reference to the following Examples, other embodiments may be made without being limited to the Examples.

In Examples and Comparative Examples, the following ingredients were used:

SA9000: Methacryl-modified polyphenylene ether (produced by SABIC, number average molecular weight Mn: 2,000 to 3,000)
SA6000: Methacryl-modified polyphenylene ether (produced by SABIC, number average molecular weight Mn: 3,000 to 5,000)
SA90: Polyphenylene ether (produced by SABIC, number average molecular weight Mn: 2,000 to 3,000)
TRIC: Triallyl isocyanurate (produced by Nippon Kasei Chemical Company Limited)
TAC: Triallyl cyanurate (produced by Nippon Kasei Chemical Company Limited)
Perbutyl D: Di-t-butyl peroxide (produced by NOF Corporation)
Perhexyne 25B: 2,5-dimethyl-2,5-di(t-butyl peroxide) hexyne-3 (produced by NOF Corporation)
Perhexa 25B: 2,5-Dimethyl-2,5-di(t-butyl peroxide)hexane (produced by NOF Corporation)
Perbutyl C: t-Butyl cumyl peroxide (produced by NOF Corporation)
Perbutyl P: α,α'-di-(t-butylperoxy)diisopropylbenzene (produced by NOF Corporation)
Perbutyl Z: t-Butyl peroxybenzoate (produced by NOF Corporation)
Polybutadiene: B-1000 (produced by Nippon Soda Co., Ltd.)
Polystyrene: PS 685 (produced by PS Japan Corporation)
Butadiene-styrene copolymer: RICON 184 (produced by CRAY VALLEY)
Core-shell silicone: KMP-600 (produced by Shin-Etsu Chemical Co., Ltd.)
Silica particles: SFP-130MC (produced by Denka Company Limited)

Examples 1 to 8 and Comparative Examples 1 to 6

The ingredients shown in Table 1 were mixed with the proportions shown in Table 1, and "SAYITEX 8010" (produced by Albemarle) was further added as a flame retardant with a proportion of 30 parts by mass relative to 100 parts by mass of the total mass of components (A), (B), and (C). The mixture was stirred at room temperature (25° C.) to yield a resin composition. The glass transition temperatures (Tg) of the resin compositions cured and thus prepared are shown in Table 1. Each resin composition was dissolved in toluene to yield a resin varnish. The mass ratio of the resin composition to toluene was 50:50.

A 100 μm-thick glass woven fabric was dipped in and impregnated with the resulting resin varnish. Then, the glass woven fabric was dried at 130° C. for 7 minutes. Thus, 100 μm-thick prepregs (resin content: 50% by mass) were prepared.

Subsequently, 8 of the resulting prepregs were stacked and laminated, and 18 μm-thick copper foil sheets were placed on both sides of the laminate. The resulting laminate was heated (195° C.) under a pressure of 4 MPa for 90 minutes to yield a 0.8 mm-thick copper clad laminate.

The copper foil was removed from the resulting copper clad laminate, and dielectric constant and dielectric loss tangent were measured at 10 GHz by a cavity resonator method. The results are shown in Table 1. For examining the heat resistance, the copper clad laminate was immersed in solder (288° C.) for 5 minutes, and then the heat resistance was evaluated according to whether or not the copper foil sheets of the copper clad laminate were swollen. For each examination, three copper clad laminates were tested. When none of the three were swollen, the heat resistance was determined to be good; when even one of the three was swollen, it was determined poor. The results are shown in Table 1.

TABLE 1

|  |  | Component (A) (% by mass) | Component (B) (% by mass) | Component (C) % by mass | Component (C) Have benzene ring? | Silica particles Parts by mass | Silica particles Average particle size | Relative dielectric constant (10 GHz) | Dielectric loss tangent (10 GHz) | Tg (° C.) | Heat resistance |
|---|---|---|---|---|---|---|---|---|---|---|---|
| Examples | 1 | SA9000 (60) | TAIC (35) | Perbutyl D (5) | No | 30 | 0.5 μm | 3.55 | 0.0025 | 220 | Good |
|  | 2 | SA9000 (60) | TAIC (35) | Perhexyne 25B (5) | No | 30 | 0.5 μm | 3.52 | 0.0035 | 275 | Good |
|  | 3 | SA9000 (60) | TAIC (35) | Perhexa 25B (5) | No | 30 | 0.5 μm | 3.56 | 0.0038 | 255 | Good |
|  | 4 | SA6000 (60) | TAIC (35) | Perbutyl D (5) | No | 30 | 0.5 μm | 3.52 | 0.0023 | 210 | Good |
|  | 5 | SA9000 (60) | TAIC (35) | Perhexyne 25B (5) | No | 30 | 0.5 μm | 3.58 | 0.0032 | 235 | Good |
|  | 6 | SA9000 (67.1) | TAIC (29.6) | Perbutyl D (3.3) | No | 30 | 0.5 μm | 3.60 | 0.0030 | 215 | Good |
|  | 7 | SA9000 (68.2) | TAIC (30.1) | Perbutyl D (1.7) | No | 30 | 0.5 μm | 3.60 | 0.0028 | 205 | Good |
|  | 8 | SA9000 (62) | TAIC (37.5) | Perbutyl D (0.5) | No | 30 | 0.5 μm | 3.55 | 0.0025 | 190 | Good |
| Comparative Examples | 1 | SA9000 (60) | TAIC (35) | Perbutyl P (5) | Yes | 30 | 0.5 μm | 3.63 | 0.0050 | 210 | Good |
|  | 2 | SA9000 (60) | TAIC (35) | Perbutyl Z (5) | Yes | 30 | 0.5 μm | 3.75 | 0.0085 | 130 | Poor |
|  | 3 | SA9000 (65) | TAIC (35) | — | — | 30 | 0.5 μm | 3.53 | 0.0023 | 150 | Poor |
|  | 4 | SA90 (60) | TAIC (35) | Perbutyl D (5) | No | 30 | 0.5 μm | 3.80 | 0.0090 | 180 | Good |
|  | 5 | SA90 (60) | TAIC (35) | Perhexyne 25B (5) | No | 30 | 0.5 μm | 3.78 | 0.0095 | 235 | Good |
|  | 6 | SA9000 (58) | TAIC (35) | Perbutyl D (10) | No | 30 | 0.5 μm | 3.52 | 0.0025 | 225 | Poor |

The value in the column of "parts by mass" of silica particles is represented relative to 100% by mass of the total mass of components (A), (B), and (C).

As shown in Table 1, Examples 1 to 8, in which the resin composition contained an organic peroxide having no benzene ring with a proportion in the range of 0.1% to 7% by mass, exhibited low dielectric loss tangents and good heat resistance.

Examples 9 to 18

The ingredients shown in Table 2 were mixed with the proportions shown in Table 2, and the above-mentioned flame retardant (SAYTEX 8010) was further added with a proportion of 30 parts by mass relative to 100 parts by mass of the total mass of components (A), (B), and (C). The mixture was stirring at room temperature (25° C.) to yield a resin composition. The glass transition temperatures (Tg) of the resin compositions cured and thus prepared are shown in Table 2. Each resin composition was dissolved in toluene to yield a resin varnish. The mass ratio of the resin composition to toluene was 50:50.

A 100 μm-thick glass woven fabric was dipped in and impregnated with the resulting resin varnish. Then, the glass woven fabric was dried at 130° C. for 7 minutes. Thus, 130 μm-thick prepregs (resin content: 50% by mass) were prepared.

Subsequently, 8 of the resulting prepregs were stacked and laminated, and 18 μm-thick copper foil sheets were placed on both sides of the laminate. The resulting laminate was heated (195° C.) under a pressure of 4 MPa for 90 minutes to cure the resin in the prepregs, thus yielding a 0.8 mm-thick copper clad laminate.

The copper foil was removed from the resulting copper clad laminate, and dielectric constant and dielectric loss tangent were measured at 10 GHz by a cavity resonator method. The results are shown in Table 2. For examining the heat resistance, the copper clad laminate was immersed in solder (288° C. and 300° C.) for 5 minutes each. The heat resistance was evaluated according to whether or not the copper foil sheets of the copper clad laminate were swollen. For each examination, three copper clad laminates were tested. When none of the three were swollen at 288° C. and 300° C., the heat resistance was determined to be good. Copper foil peel strength was measured by 90-degree peeling test. The results are shown in Table 2.

TABLE 2

| | | Composition | | | | | | | | | | Properties | | | | |
|---|---|---|---|---|---|---|---|---|---|---|---|---|---|---|---|---|
| | | Component (A) (% by mass) | | Component (B) (% by mass) | | Component (D) (% by mass) | | | | | Component (C) Perbutyl D (% by mass) | Silica particles 0.5 μm (Parts by mass) | Dielectric constant 10 GHz | dielectric loss tangent 10 GHz | Tg (° C.) | Copper peel foil strength (KN/m) | Heat resistance |
| | | SA 9000 | SA 6000 | TAIC | TAC | Butadiene-styrene copolymer 20/80 | 50/50 | E0/2C | Poly-butadiene | Poly-styrene | | | | | | | |
| Examples | 9 | 59 | — | 35 | — | 1 | — | — | — | — | 5 | 30 | 3.55 | 0.0024 | 220 | 0.75 | Good |
| | 10 | 55 | — | 35 | — | 5 | — | — | — | — | 5 | 30 | 3.54 | 0.0023 | 210 | 0.75 | Good |
| | 11 | 50 | — | 35 | — | 10 | — | — | — | — | 5 | 30 | 3.53 | 0.0022 | 205 | 0.77 | Good |

TABLE 2-continued

| | Composition | | | | | | | | | | Properties | | | | |
|---|---|---|---|---|---|---|---|---|---|---|---|---|---|---|---|
| | Component (A) (% by mass) | | Component (B) (% by mass) | | Component (D) (% by mass) | | | | | Component (C) Perbutyl D (% by mass) | Silica particles 0.5 μm (Parts by mass) | Dielectric constant 10 GHz | dielectric loss tangent 10 GHz | Tg (° C.) | Copper peel foil strength (KN/m) | Heat resistance |
| | | | | | Butadiene-styrene copolymer | | | Poly-butadiene | Poly-styrene | | | | | | | |
| | SA 9000 | SA 6000 | TAIC | TAC | 20/80 | 50/50 | E0/2C | | | | | | | | | |
| 12 | 45 | — | 35 | — | 15 | — | — | — | — | 5 | 30 | 3.52 | 0.0021 | 200 | 0.78 | Good |
| 13 | 40 | — | 35 | — | 20 | — | — | — | — | 5 | 30 | 3.50 | 0.0019 | 195 | 0.81 | Good |
| 14 | 50 | — | 35 | — | — | — | 2 | — | 8 | 5 | 30 | 3.58 | 0.0032 | 235 | 0.73 | Good |
| 15 | — | 50 | 35 | — | 10 | — | — | — | — | 5 | 30 | 356 | 0.0024 | 200 | 0.79 | Good |
| 16 | 50 | — | — | 35 | 10 | — | — | — | — | 5 | 30 | 3.55 | 0.0023 | 190 | 0.80 | Good |
| 17 | 50 | — | 35 | — | 10 | — | — | — | — | 5 | 30 | 3.55 | 0.0025 | 200 | 0.73 | Good |
| 18 | 50 | — | 35 | — | — | 10 | — | — | — | 5 | 30 | 3.56 | 0.0029 | 190 | 0.70 | Good |

"20/80" "50/50", and "80/20" for Butadiene-styrene copolymer each represent a mass ratio of butadiene to styrene.
The value in the column of silica particles is represented relative to 100% by mass of the total mass of components (A), (B), and (C).

As shown in Table 2, the copper clad laminates prepared by using the resin composition of any of Examples 9 to 18, which contains a mixture of polybutadiene and polystyrene or a butadiene-styrene copolymer (component (D)) with a proportion in the range of 0.5% to 20% by mass, exhibited low dielectric loss tangents and good heat resistance and adhesion.

Examples 19 to 24

The ingredients shown in Table 3 were mixed with the proportions shown in Table 3, and the above-mentioned flame retardant (SAYTEX 8010) was further added with a proportion of 30 parts by mass relative to 100 parts by mass of the total mass of components (A), (B), and (C). The mixture was stirring at room temperature (25° C.) to yield a resin composition. The glass transition temperatures (Tg) of the resin compositions cured and thus prepared are shown in Table 3. Each resin composition was dissolved in toluene to yield a resin varnish. The mass ratio of the resin composition to toluene was 50:50.

A 100 μm-thick glass woven fabric was dipped in and impregnated with the resulting resin varnish. Then, the glass woven fabric was dried at 130° C. for 7 minutes. Thus, 130 μm-thick prepregs (resin content: 50% by mass) were prepared.

Subsequently, 8 of the resulting prepregs were stacked and laminated, and 18 μm-thick copper foil sheets were placed on both sides of the laminate. The resulting laminate was heated (195° C.) under a pressure of 4 MPa for 90 minutes to cure the resin in the prepregs, thus yielding a 0.8 mm-thick copper clad laminate.

The copper foil was removed from the resulting copper clad laminate, and dielectric constant and dielectric loss tangent were measured at 10 GHz by a cavity resonator method. The results are shown in Table 3. For examining the heat resistance, the copper clad laminate was immersed in solder (288° C. and 300° C.) for 5 minutes each. The heat resistance was evaluated according to whether or not the copper foil sheets of the copper clad laminate were swollen. For each examination, three copper clad laminates were tested. When none of the three were swollen at 288° C. and 300° C., the heat resistance was determined to be good. The results are shown in Table 3.

Next, a through hole was formed in each copper clad laminate, and a circuit (wiring layer) and a through-hole conductor were formed to yield an inner layer plate. The inner layer plate and the prepreg were placed one on the other and heated (195° C.) under a pressure of 4 MPa for 90 minutes to yield a wiring board. For examining the connection between the through-hole conductor and the wiring layer, the section of the wiring board was checked with a scanning electron microscope. When the through-hole conductor and the wiring layer were connected without failure, the connection was determined to be good. The results are shown in Table 3.

TABLE 3

| | | Component (A) (% by mass) | Component (B) (% by mass) | Component (E) (% by mass) | Component (C) (% by mass) (Have benzene ring?) | Silica particles (parts by mass) | Relative dielectric constant (10 GHz) | Dielectric loss tangent (10 GHz) | Tg (° C.) | Heat resistance | Connection |
|---|---|---|---|---|---|---|---|---|---|---|---|
| Examples | 19 | SA9000 (59.9) | TAIC (35) | KMP-600(0.1) | Perbutyl D (5) (No benzene ring) | 30 | 3.55 | 0.0025 | 220 | Good | Good |
| | 20 | SA9000 (59) | TAIC (35) | KMP-600(1) | Perhexyne 25B (5) (No benzene ring) | 30 | 3.55 | 0.0025 | 220 | Good | Good |
| | 21 | SA9000 (57) | TAIC (35) | KMP-600(3) | Perhexa 25B (5) (No benzene ring) | 30 | 3.56 | 0.0038 | 245 | Good | Good |
| | 22 | SA6000 (55) | TAIC (35) | KMP-600(5) | Perbutyl D (5) (No benzene ring) | 30 | 3.52 | 0.0023 | 210 | Good | Good |
| | 23 | SA9000 (62.4) | TAIC (29.6) | KMP-600(3) | Perbutyl D (5) (No benzene ring) | 30 | 3.60 | 0.0028 | 230 | Good | Good |

TABLE 3-continued

| | Component (A) (% by mass) | Component (B) (% by mass) | Component (E) (% by mass) | Component (C) (% by mass) (Have benzene ring?) | Silica particles (parts by mass) | Relative dielectric constant (10 GHz) | Dielectric loss tangent (10 GHz) | Tg (° C.) | Heat resistance | Connection |
|---|---|---|---|---|---|---|---|---|---|---|
| 24 | SA9000 (66.6) | TAIC (25.4) | KMP-600(3) | Perbutyl D (5) (No benzene ring) | 30 | 3.60 | 0.0029 | 235 | Good | Good |

The value in the column of "silica particles (parts by mass)" is represented relative to 100% by mass of the total mass of components (A), (B), and (C).
The average particle size of silica particles is 0.5 μm.
Connection refers to the connection between the through-hole conductor and the wiring layer.

As shown in Table 3, the resin compositions of Examples to 24, which contain a silicone polymer (component (E)) having a core-shell structure with a proportion in the range of 0.1% to 5% by mass, exhibited low dielectric loss tangents and good heat resistance. Furthermore, it is shown that the wiring board produced by using such a resin composition can be reliable in connection between the through-hole conductor and the wiring layer.

Examples 25 to 30

The ingredients shown in Table 4 were mixed with the proportions shown in Table 4, and the above-mentioned flame retardant (SAYTEX 8010) was further added with a proportion of 30 parts by mass relative to 100 parts by mass of the total mass of components (A), (B), and (C). Subsequently, toluene was added in the resin composition-to-toluene mass ratio shown in Table 4, and the mixture was stirred at room temperature (25° C.) to yield a resin composition (resin varnish).

A 100 μm-thick glass woven fabric was dipped in and impregnated with the resulting resin varnish. Then, the glass woven fabric was dried at 130° C. and at the dry air volume shown in Table 4 for 7 minutes, and thus, 100 μm-thick prepregs (resin content: 50% by mass; glass woven fabric: 50% by mass) were prepared. The toluene content (amount of remaining toluene) in the prepreg was measured by gas chromatography. The results are shown in Table 4.

Subsequently, 8 of the resulting prepregs were stacked and laminated. Then, 18 μm-thick copper foil sheets were placed on both sides of the laminate. The resulting laminate was heated (195° C.) under a pressure of 4 MPa for 90 minutes to cure the resin in the prepregs, thus yielding a 0.8 mm-thick copper clad laminate. The glass transition temperature (Tg) of the cured prepreg was shown in Table 4.

The copper foil was removed from the resulting copper clad laminate, and dielectric constant and dielectric loss tangent were measured at 10 GHz by a cavity resonator method. The results are shown in Table 4. For examining the heat resistance, the copper clad laminate was immersed in solder (288° C.) for 5 minutes, and then the heat resistance was evaluated according to whether or not the copper foil sheets of the copper clad laminate were swollen. For each examination, three copper clad laminates were tested. When none of the three were swollen, the heat resistance was determined to be good. Copper foil peel strength was measured by 90-degree peeling test. The results are shown in Table 4.

TABLE 4

| | | Resin composition | | | | | | | | | | |
|---|---|---|---|---|---|---|---|---|---|---|---|---|
| | | Component (A) (% by mass) | Component (B) (% by mass) | Component (C) (% by mass) (Have benzene ring?) | Resin-to-toluene (mass ratio) | Silica particles (Parts by mass) | Dry air volume (N/m) | Toluene in prepreg (% by mass) | Relative dielectric constant (10 GHz) | Dielectric loss tangent (10 GHz) | Tg (° C.) | Heat resistance | Copper foil peel strength (KN/m) |
| Examples | 25 | SA9000 (60) | TAIC (35) | Perbutyl D (5) (No benzene ring) | 50:50 | 30 | 80 | 0.1 | 3.55 | 0.0025 | 220 | Good | 0.60 |
| | 26 | SA9000 (60) | TAIC (35) | Perbutyl D (5) (No benzene ring) | 50:50 | 30 | 70 | 0.2 | 3.52 | 0.0027 | 215 | Good | 0.63 |
| | 27 | SA9000 (60) | TAIC (35) | Perbutyl D (5) (No benzene ring) | 50:50 | 30 | 60 | 0.3 | 3.56 | 0.0029 | 210 | Good | 0.65 |
| | 28 | SA6000 (60) | TAIC (35) | Perbutyl D (5) (No benzene ring) | 50:50 | 30 | 50 | 0.5 | 3.52 | 0.0031 | 200 | Good | 0.67 |
| | 29 | SA9000 (65) | TAIC (30) | Perbutyl D (5) (No benzene ring) | 50:50 | 30 | 60 | 0.3 | 3.56 | 0.0031 | 230 | Good | 0.63 |

TABLE 4-continued

| | Resin composition | | | | | | | | | | | |
|---|---|---|---|---|---|---|---|---|---|---|---|---|
| | Component (A) (% by mass) | Component (B) (% by mass) | Component (C) (% by mass) (Have benzene ring?) | Resin-to-toluene (mass ratio) | Silica particles (Parts by mass) | Dry air volume (N/m) | Toluene in prepreg (% by mass) | Relative dielectric constant (10 GHz) | Dielectric loss tangent (10 GHz) | Tg (° C.) | Heat resistance | Copper foil peel strength (KN/m) |
| 30 | SA9000 (70) | TAIC (25) | Perbutyl D (5) (No benzene ring) | 50:50 | 30 | 60 | 0.3 | 3.60 | 0.0033 | 240 | Good | 0.61 |

The value in the column of "silica particles (parts by mass)" is represented relative to 100% by mass of the total mass of components (A), (B), and (C).
The average particle size of silica particles is 0.5 μm.

As shown in Table 4, each of the prepregs of Examples 25 to 30, in which the toluene content was 0.5% by mass or less, exhibited a low dielectric constant and dielectric loss tangent, a high glass transition temperature, and good heat resistance. Also, the 90-degree peeling test results suggest that the copper foil of these prepregs is unlikely to peel.

The invention claimed is:

1. A resin composition comprising:
a component (A) being methacryl-modified polyphenylene ether;
a compound (B) being at least one of triallyl isocyanurate and triallyl cyanurate;
a component (C) being di-t-butyl peroxide, and
a component (D) being a butadiene-styrene copolymer,
wherein a mass ratio of the butadiene and the styrene in the component (D) is 5:95 to 20:80,
wherein the component (A) is contained with a proportion of 50% to 75% by mass relative to 100% by mass of the total mass ((A)+(B)+(C)) of the components (A), (B), and (C),
wherein the component (B) is contained with a proportion of 20% to 43.75% by mass relative to 100% by mass of the total mass ((A)+(B)+(C)) of the components (A), (B), and (C),
wherein the component (C) is contained with a proportion of 0.1% to 7% by mass relative to 100% by mass of the total mass ((A)+(B)+(C)) of the components (A), (B), and (C), and
wherein the component (D) is contained with a proportion of 5% to 20% by mass relative to 100% by mass of the total mass of the components (A), (B), (C), and (D).

2. The resin composition according to claim 1, further comprising
a component (E) being a silicone polymer having a core-shell structure with a proportion of 0.1% to 5% by mass relative to 100% by mass of the total mass of the components (A), (B), (C), and (E).

3. The resin composition according to claim 1, further comprising silica.

4. A prepreg comprising:
the resin composition as set forth in claim 1; and
a base material.

5. The prepreg according to claim 4, wherein the content of toluene is 0.5% by mass or less.

6. A metal-clad laminate comprising:
the prepreg as set forth in claim 4; and
a metal foil on a surface of the prepreg.

7. The metal-clad laminate according to claim 6, wherein the resin composition in the prepreg contains a cross-linked product of the components (A) and (B).

8. A wiring board comprising:
a plurality of insulating layers; and
an electrically conductive layer between the insulating layers, wherein
the insulating layers each comprises the resin composition as set forth in claim 1 and a base material.

* * * * *